United States Patent [19]
Ferrant et al.

[11] Patent Number: 5,506,807
[45] Date of Patent: Apr. 9, 1996

[54] MEMORY CIRCUIT WITH REDUNDANCY

[75] Inventors: Richard Ferrant, Le Fontanil Cornillon; Lysiane Koechlin, Grenoble, both of France

[73] Assignee: Thomson-CSF Semiconducteurs Specifiques, Paris, France

[21] Appl. No.: 393,004

[22] Filed: Mar. 3, 1995

[30] Foreign Application Priority Data

Sep. 8, 1992 [FR] France .................................. 92 10695

[51] Int. Cl.$^6$ ...................................................... G11C 7/00
[52] U.S. Cl. .................. 365/200; 365/225.7; 365/230.02; 371/10.2
[58] Field of Search .............................. 365/200, 225.7, 365/230.02; 371/10.1, 10.2

[56] References Cited

U.S. PATENT DOCUMENTS

| | | | |
|---|---|---|---|
| 5,122,987 | 6/1992 | Kihara ...................... | 365/200 |
| 5,134,585 | 7/1992 | Murakami et al. ...................... | 365/200 |
| 5,301,153 | 4/1994 | Johnson ...................... | 365/200 |
| 5,355,339 | 10/1994 | Oh et al. ...................... | 365/200 |

Primary Examiner—David C. Nelms
Assistant Examiner—Son Dinh
Attorney, Agent, or Firm—Oblon, Spivak, McClelland, Maier & Neustadt

[57] ABSTRACT

A novel redundancy architecture for an integrated-circuit memory is utilized having no redundancy columns separate from the useful columns but with each useful column, except for the first column, serving as a redundancy column for any adjacent defective column. If a column of order j, normally designated by an output of order j of the column decoder DC, is serviceable, it is actually this column which will be selected by the corresponding output of the decoder DC. On the other hand, if the column is defective, no specialized remote redundancy column will be sought for the repair but instead the output of the decoder will be made to select the following column (order j+1), which would normally have been designated by the following output (order j+1) of the decoder. The other decoder output will be routed towards a third column (order j+2), etc. Therefore, the links between the decoder outputs and the column used will be progressively offset. The memory plane is seen in groups of n+1 columns with the row DR and column DC decoders. A fuse circuit CF designates a defective column. Through the use of this architecture all of the columns can be tested even those which are not being used.

8 Claims, 5 Drawing Sheets

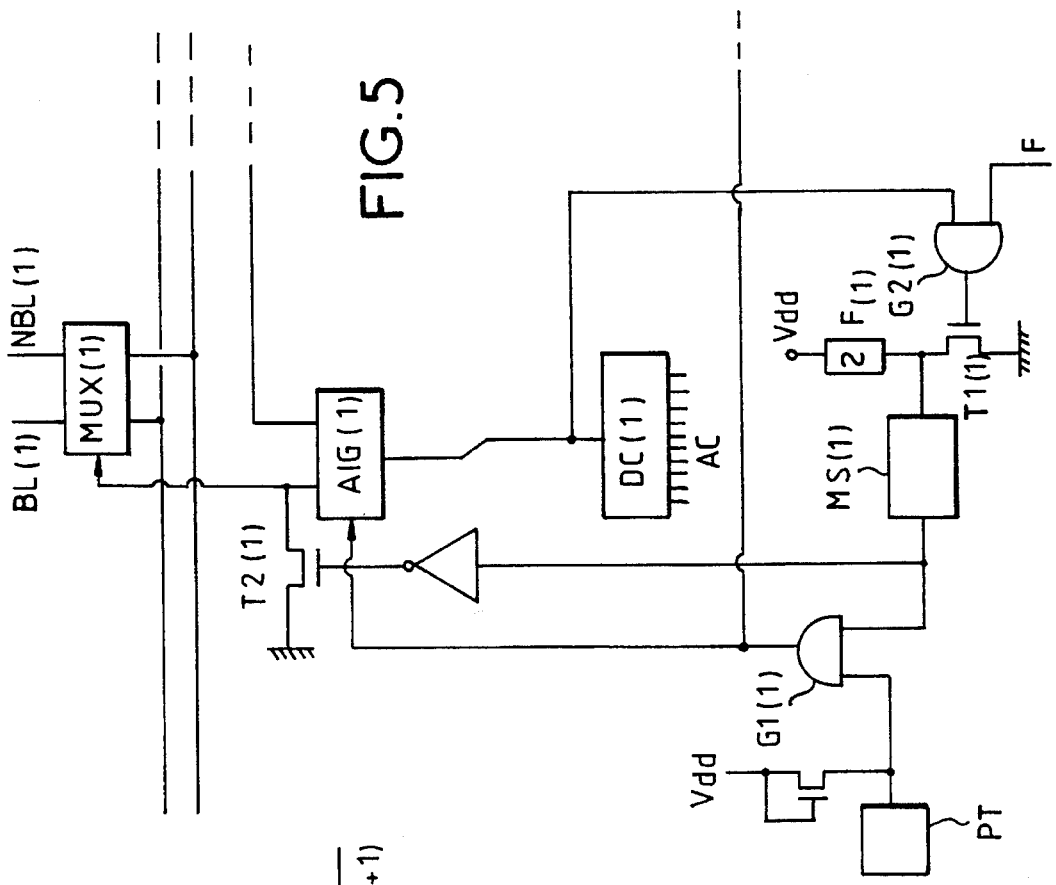
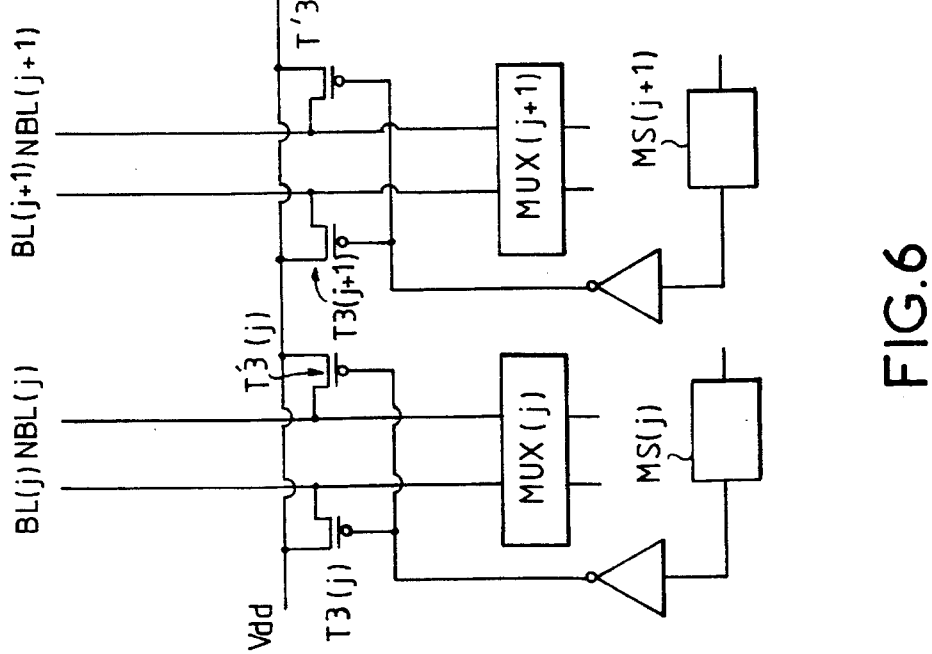

MEMORY CIRCUIT WITH REDUNDANCY

SUMMARY OF THE INVENTION

FIELD OF THE INVENTION

The invention relates to an integrated-circuit memory, produced in the form of a matrix array of lines and of columns.

DISCUSSION OF BACKGROUND

In order to increase the yield in fabricating memories with high storage capacity, which use extremely fine integration technologies which are therefore difficult to implement without defect, it is usual to provide entire lines (in rows or in columns) of redundancy elements.

If the testing of the memory reveals that a row or a column of memory cells is defective, it is replaced by a row or a column of redundancy elements. Seen from outside the integrated circuit, the memory should then appear to be completely serviceable: the implementation of the redundancy is transparent for the user.

In what follows, the word "line" will be used whenever it is desired to speak non-specifically of a row or of a column, and the columns and the rows of the array will be distinguished in the usual way: the memory cells of the matrix array are connected in rows and in columns; all the cells of a single column are connected to the same column conductor (called bit line) on which information may be read or written, and all the cells of a single row are connected to the same row conductor (called word line) which serves to address a particular row of cells. In the case of the most complex memories, there may be a row decoder which designates a particular row, and a column decoder which designates a particular group of columns in order to route the bit lines corresponding to this group to the data input/output leads of the integrated circuit.

Several redundancy circuit architectures have already been proposed. One possible architecture is that in which at least one redundancy line (row or column) is placed beside a group of lines (rows or columns), in such a way as to be able to replace any defective line of this group by the redundancy line. A fuse is associated with each line capable of being replaced; the fuse is blown in order to isolate the defective line from the rest of the circuit and in order to connect the redundancy line in its place.

Other architectures make provision for not just one fuse associated with each line capable of being defective, but a battery of n fuses associated with a group of lines in which a replacement may be able to be effected; the battery makes it possible to store the address of the defective line (a k-bit address requires a battery of k fuses). This battery, that is to say a group of k fuses, is coupled to a comparator which receives an address applied to the input of the memory; if the address applied to the memory is exactly equal to the defective address stored in memory by the battery, the comparator causes disconnection of the defective line and connection of the replacement line.

The implementation of redundancy poses a problem which is that of the efficiency of blowing of the fuses. This efficiency is not 100% and it happens that a fuse which it is desired to blow proves in reality to be poorly blown, without the possibility of repeating the blowing operation. By blowing of the fuse is meant either the open-circuiting of a fuse which was conducting in the intact state, or, on the contrary, the putting into the conducting state of a fuse which was not conducting in the intact state.

Among the general objectives when producing an integrated-circuit memory must be the improvement of the overall repair efficiency when employing redundancy.

There is also the ease of a complete test of the memory, including the redundancy elements, and including the unused redundancy elements. It has been seen, in fact, that in certain cases it was not sufficient for the memory to be serviceable overall with the redundancy elements which were put into service in order to repair defects: it is necessary furthermore for the unused redundancy elements not to exhibit defects which would entail the memory not being in conformity with certain specifications, for example an exaggerated current consumption as a result of leaks in the region of the unused redundancy elements. However, the unused redundancy elements are very difficult of access and it is not always possible to test them.

Another objective for a memory may sometimes be the possibility for repair, not only at the time of fabrication (in the course of the test on the wafer), but also during use.

Finally, one objective must always be transparency with regard to the user, who must not see the difference between a memory which has required repair of a defect to be undertaken and a memory which has not required this repair. However, more often, the additional connections added to gain access to the repair line lengthen the information access time for the repaired addresses with respect to the information access time for the normal addresses.

SUMMARY OF THE INVENTION

The object of the present invention is to propose a memory architecture which best takes these various concerns into consideration.

In the architecture proposed by the invention, there are no redundancy lines separate from the useful lines, but each useful line (except the first) may serve as a redundancy line for a nearby line which might be defective.

In practice, if a useful line, normally designated by one decoder output, is serviceable, then it is actually this line which will be selected by the corresponding output of the decoder; if, on the contrary, this line is defective, no specialized remote redundancy line will be sought for the repair, but the output of the decoder will be made to select the following line, which would normally have had to be designated by another decoder output; this other decoder output will be routed towards a third line, and so on; thus, the links between the decoder outputs and the lines used will be progressively offset.

According to one possible definition of the invention, a memory is proposed including at least one array of n+1 successive lines of memory elements, a decoder having n outputs, the output of order j serving to designate a line defined on the basis of an address applied to the decoder, and redundancy circuitry for replacing any line of elements which is defective by a replacement line, characterized in that the redundancy circuitry includes means for making either the line of order j or the line of order j+1 active via the output of order j of the decoder (j varying from 1 to n). The word line should be understood in the broad sense: row or column.

The preferred operation is as follows: if there is no implementation of redundancy, each output of order j of the decoder selects a line of the same order j in the succession of lines. The last line, of order n+1 is not used. If redundancy is implemented due to a defective line of order r, then the outputs of order j less than r each activate a corresponding line of order j, and the outputs of order j greater than or equal to r each activate a line of respective order j+1.

In order to do that, a fuse is preferably provided, associated with each line of order j=1 to n of the succession, with, for each order j, a routing circuit interposed between the output of order j of the decoder and the lines of order j and j+1, so as to make either the line of order j or the line of order j+1 active via the output of order j of the decoder, this routing being controlled by a logic circuit of order j receiving, on the one hand, information on the state of the fuse of order j and, on the other hand, information originating from the logic circuit of preceding order j−1 (except for the order j=1).

Thus, the line of order j is designated by the output of order j of the decoder when all the fuses of order 1 to j are in the intact state. However, the line of order j+1 is designated by the output of order j of the decoder when one of the fuses of order 1 to j is blown.

In principle, only one possibility for repair will be used for a group of n lines, but it would be possible, in certain cases, to envisage there being several possibilities for repair: for example, n+2 lines are provided for two possibilities for repair of a group of n lines controlled by a decoder with n outputs. The routing circuits are then more complex since they must be able to route the output of order j to a line of order j, or j+1 or j+2, depending on the implementation of zero, one or two repairs. However, the principle is the same.

In the case in which the lines are columns of memory elements connected to the same bit line, the memory includes a multiplexer between the bit lines and the memory input/output leads. The multiplexer includes individual multiplexing elements each corresponding to one bit line. Each multiplexing element can route a given bit line to one input/output lead or to one read or read/write amplifier linked to this lead. In this case, there is provision, according to the invention, for each multiplexer element of order j (j=1 to n+1), except the first, to be controlled preferably either by a routing circuit of order j or by a routing circuit of order j−1; the routing circuit of order j has two outputs, one for controlling the multiplexing element of order j, and the other for controlling the multiplexing element of order j+1, depending on the fact that redundancy is or is not implemented in the orders 1 to j. The routing circuit of order j, to this end, has two inputs: one is a designation control input originating from the output of order j of the decoder, so that this routing circuit is designated by the decoder when the address corresponding to the order j is received by the decoder; the other input of the routing circuit is a routing control input; it makes it possible to choose one of the two outputs of the routing circuit designated by the decoder, the choice depending on the implementation or the absence of implementation of redundancy in the orders 1 to j. This second control input of the routing circuit is controlled by an associated redundancy logic circuit, of order j, depending particularly on the state of the fuse of order j.

The redundancy logic circuit of order j, which controls the routing, preferably comprises the following elements: a monostable latch linked to the fuse of order j, this latch being held in a first state when the fuse is intact and being released into a second state when the fuse is blown; a dual-input gate receiving, on the one hand, the output of the monostable latch and, on the other hand, an output of the logic circuit of preceding order, this gate supplying an output signal applied, on the one hand, to the logic circuit of following order j+1 and, on the other hand, to the routing circuit of order j.

Among the advantages conferred by the architecture proposed by the present invention the following may be mentioned:

First of all, the number of fuse blowings is minimized: a single fuse is blown in order to implement a redundancy; there is not, as in the prior art, at least one fuse for designating the repaired line and another for indicating that redundancy is implemented. And, a fortiori, there is not a battery of fuses to be blown for a single implementation of redundancy. Here, the effectiveness of blowing which is not equal to 100% makes the fact of having only one single fuse to blow very beneficial.

The lengths of connections and the circuitry between the repair line and the rest of the circuit are minimized: there is no lengthy connection between a remote repair line and the other lines, which would tend to lengthen the access time (capacitive effect of long lines, and transit time in the gates) for the repaired line with respect to the access time for the other lines. Here, the access times are the same for all the lines, and are relatively independent of the fact that redundancy is or is not implemented.

The logic added for the redundancy may be logic without current consumption.

The proposed architecture makes it possible, if so desired, very easily to control the interruption of the power supply to the defective lines (in other words, not to be restricted to disconnecting them from the input/output circuits, but to cut off their power supply), which is important in certain cases and which is not allowed by all redundancy architectures.

An important point is that this novel architecture makes it possible completely to test all the lines (n+1 lines), that is to say the useful lines and the redundancy lines, even the unused lines, which is not allowed in certain redundancy architectures.

Finally, by adding very limited circuitry, it is possible to check a memory even during use: it is possible first of all easily to check whether the redundancy has already been implemented and then to carry out a repair if such is not the case and if a defect has been noted.

DESCRIPTION OF THE DRAWINGS

Other characteristics and advantages of the invention will emerge on reading the detailed description which follows and which is given by reference to the attached drawings in which:

FIG. 5 represents another part which completes FIG. 3 (first order).

FIG. 6 represents an improvement in which the power supply to the defective bit lines is cut.

DETAILED DESCRIPTION OF THE PREFERRED EMBODIMENT

The invention will be described solely in the context of the case in which redundancy columns are provided in replacement for defective columns (bit lines) of the memory. But it obviously also applies to the repair of defective rows (word lines).

Figure 1:
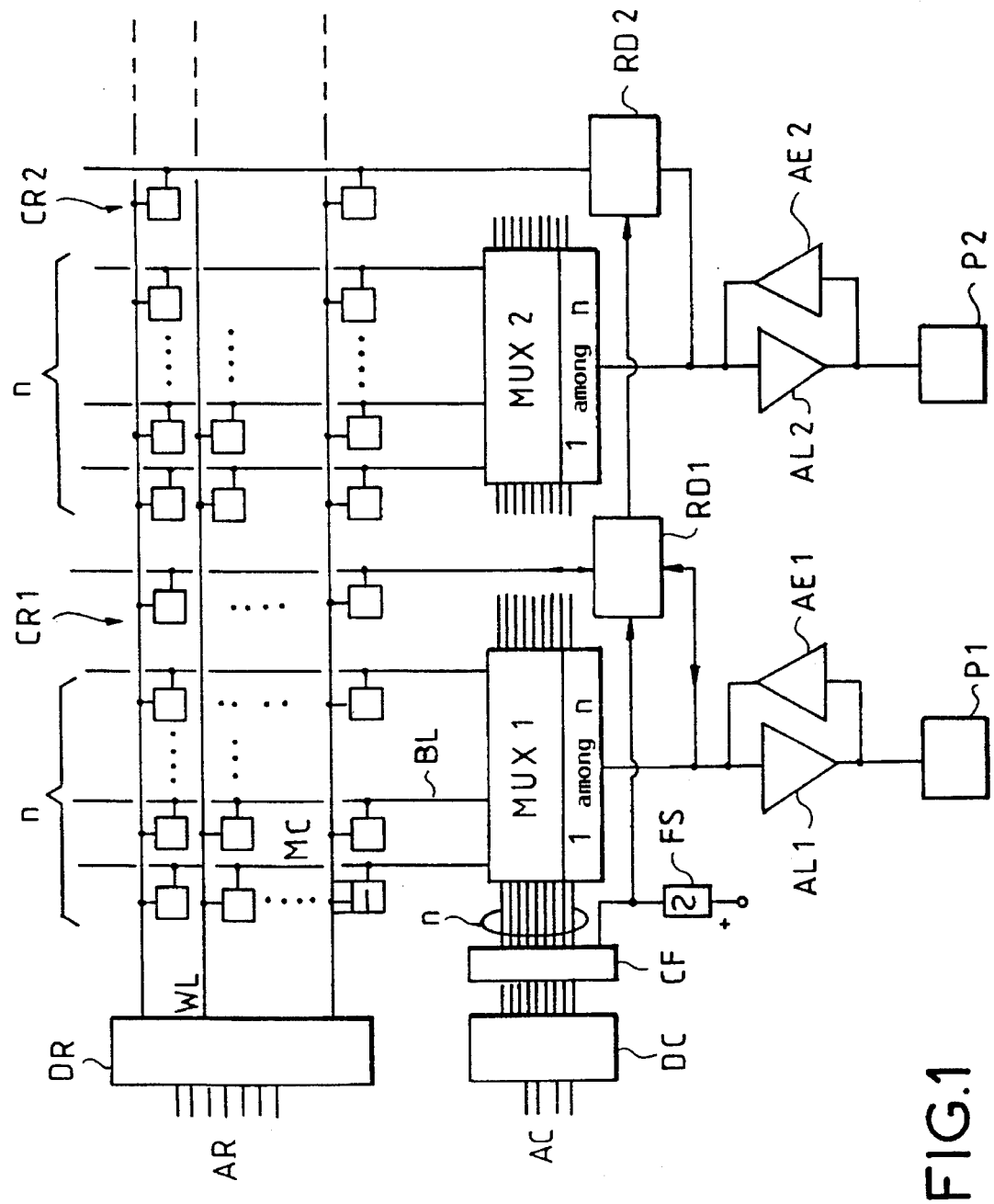
FIG. 1 represents the conventional architecture of a memory with redundancy circuitry for repairing defective columns.

In FIG. 1, a memory has been represented comprising an array of memory cells MC arranged in rows and columns. The cells of a single row are linked to a single word line WL originating from a row decoder DR which makes it possible to designate one row from among N on the basis of a row address AR. The cells of a single column are linked to a single bit line BL which makes it possible to read or write information in the cell situated at the intersection of this bit line and of the selected word line.

In the general case in which the number Z of columns of the memory is a multiple of the number p of data input/output leads of the memory (Z=n.p), there is a column decoder DC which receives a column address AC and controls a multiplexer MUX. The columns are then associated into P groups of n columns. The groups are juxtaposed or imbricated into one another. The multiplexer makes it possible to select one bit line among n, in each group, and to connect it to a read amplifier and a write amplifier, these latter being linked to a data lead. In the figure, two groups of n columns have been represented with two multiplexers respectively MUX1, MUX2 (controlled simultaneously by the decoder DC), two read amplifiers AL1, AL2, two write amplifiers AE1, AE2, and two data leads P1, P2.

When there is redundancy circuitry, there is generally a supplementary column of elements associated with each group of n columns. This supplementary column is designated by CR1 for the first group, CR2 for the second; redundancy circuitry RD1, RD2 is provided, which controls access to this redundancy column and a fuse circuit CF (n fuses), in the column decoder DC, or interposed between the column decoder and the control inputs of the multiplexer, in order to prohibit access to the defective column by simple blowing of the fuse corresponding to this column. A supplementary fuse FS allows the redundancy circuits RD1, RD2 to be activated if redundancy is used.

Figure 2:
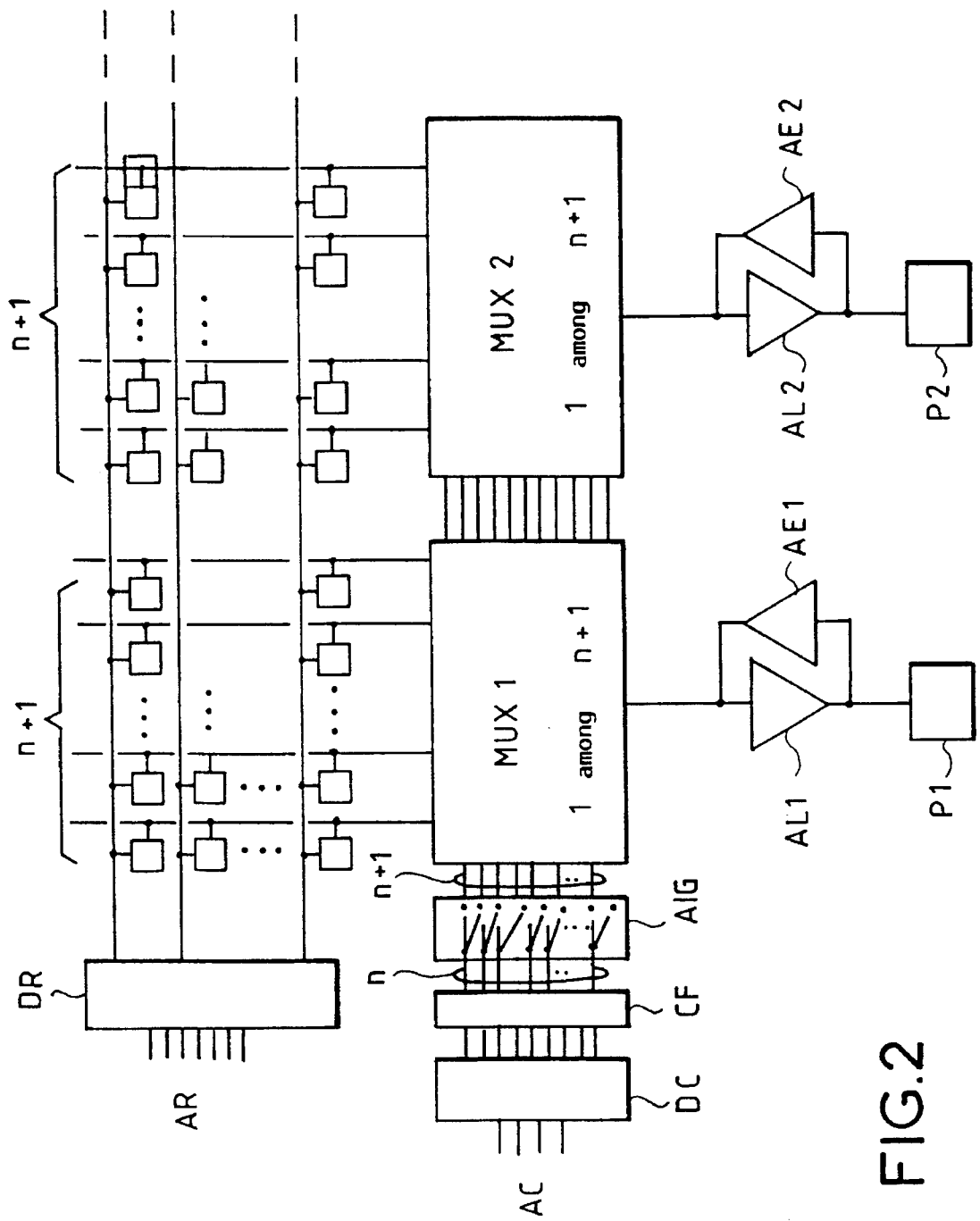
FIG. 2 represents the general architecture of a memory according to the invention.

FIG. 2 represents the general diagram of the modification afforded by the invention to the architecture of FIG. 1.

There is no longer a specific column for redundancy. However, in each group of columns, there are n+1 identical columns each of which (except the first) can serve as replacement column for the preceding column if the latter proves to be defective. The multiplexer MUX1, MUX2 therefore, for each group, has n+1 bit line connections and can select any one from among n+1 bit lines in order to link it to the corresponding lead P1 or P2. The column decoder DC, which has only n outputs, now controls the multiplexer MUX through a routing circuit AIG. The routing circuit AIG operates under the control of the decoder and, at the same time, under the control of the fuse circuit CF: if redundancy is not necessary, the first n bit lines are used and the order j of a selected bit line corresponds to the order j of the output of the decoder which selects it. If a column of order r is defective, the fuse of order r is blown; the routing circuit AIG then makes each bit line of order j less than r correspond to a corresponding output of order j of the decoder, and makes each bit line of order j higher than r correspond to the output of order r−1 of the decoder. The bit line of order r can no longer be selected by the decoder.

The routing circuit AIG has been represented in FIG. 2 as separate from the multiplexer MUX. This is done for ease of representation, but it will be understood that the routing unit, and likewise also the fuse circuit, may be heavily imbricated within the multiplexer. The important thing is the mode of operation with offset by one unit between the order of the selected bit line and the order of the output of the decoder, for all the lines which follow the defective line but not for those which precede it.

Figure 3:
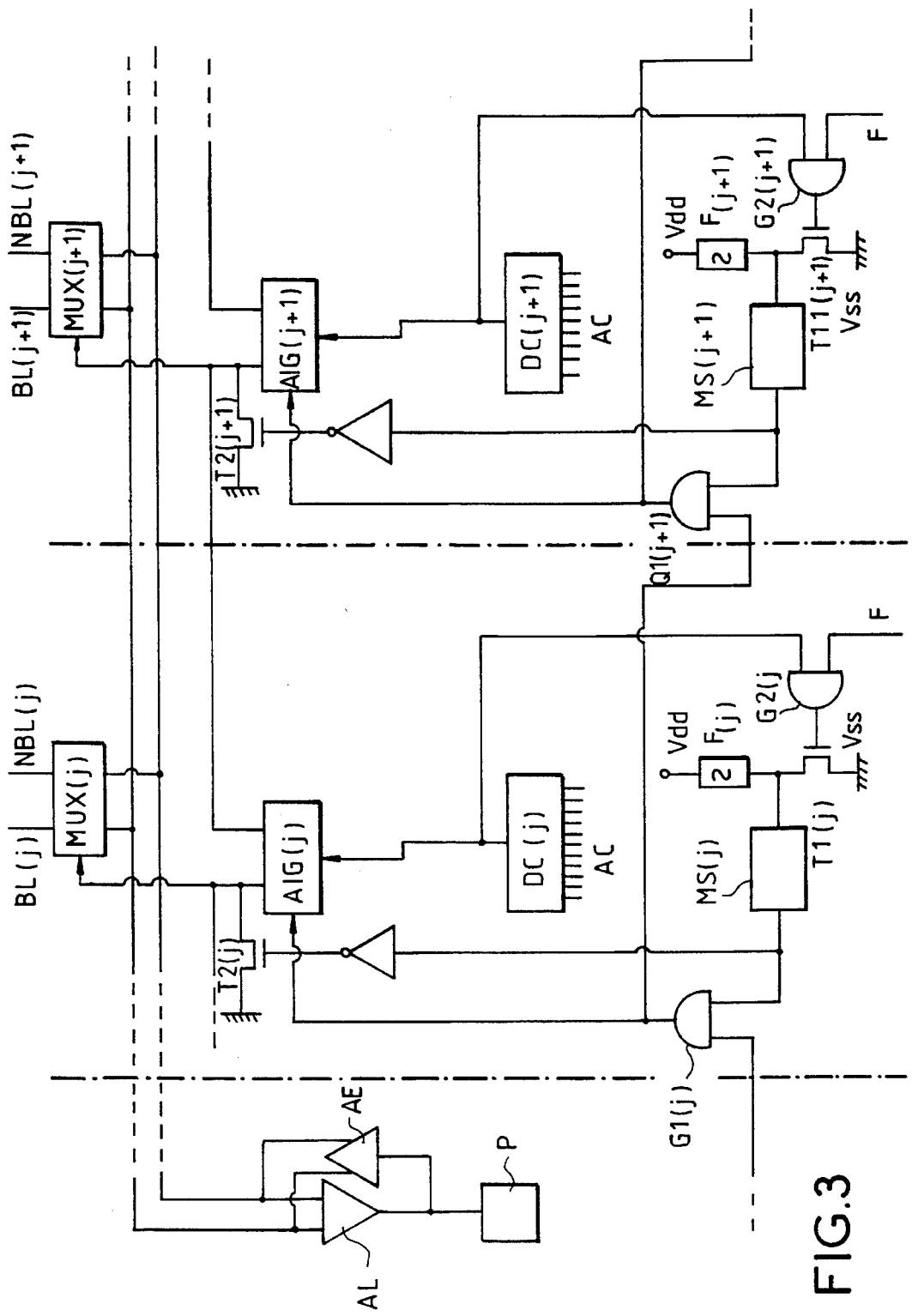
FIG. 3 represents a detailed diagram of the preferred embodiment of the invention.

FIG. 3 represents a detailed embodiment of the invention for obtaining the operation described above.

A single group of n columns is considered, with a single data input/output lead P, connected by a read amplifier AL and a write amplifier AE to the outputs of a multiplexer MUX. Obviously, if the memory is organized into m-bit words, there are m leads and the circuit of FIG. 3 should be repeated m times.

The output of the multiplexer MUX, connected to the read and write amplifiers, is here a two-wire output if the memory cells of a single column are connected to the multiplexer by a pair of complementary bit lines.

The inputs of the multiplexer MUX are the n+1 pairs of complementary bit lines capable of being connected to the lead P: bit line BL(j) and complementary line NBL(j) for order j, lines BL(j+1) and NBL(j+1) for order j+1, etc.

The multiplexer may thus be represented in the form of n+1 elements, of order j=1 to n+1, each element of order j receiving a specific bit line BL(j)/NBL(j).

The decoder, the fuse circuit, and the routing circuit are themselves each broken down into n elements, each element corresponding to a defined order, that is to say to a defined address supplied to the decoder; only two successive elements, of orders j and j+1, are represented in FIG. 3. The segment of order j is identified on the figure between two vertical lines of dots and dashes.

The element of order j of the decoder, referenced DC(j), supplies a logic level 1 on its output if the address received represents order j and a level 0 in the opposite case. This output is linked to an input for designating the routing circuit element AIG(j) of the same order j.

The routing element of order j is therefore active only if the address received by the decoder corresponds to the order j. The element AIG(j) has two outputs making it possible to activate either the multiplexing element of the same order MUX(j) or the multiplexing element of immediately following order MUX(j+1) according to choice. For example, the first output is linked to a control input of the element MUX(j) and makes it active (hence connects the bit line of order j to the lead P) by imposing a high logic level (1) on this control input; the other output is linked to the control input of the element MUX(j+1) and makes it active (hence connects the bit line of order j+1 to the lead P) by imposing a high logic level (1) on this input. However, when the routing element is made inactive by the decoder DC(j), its two outputs are at a low logic level (0) and neither the bit line BL(j) nor the following line BL(j+1) can be connected to the lead P. The routing circuit therefore has one inactive state and two complementary active states.

It will be noted that the control input of the multiplexer element of order j receives not only the first output of the routing element AIG(j) of the same order, but also the second output of the routing element of preceding order j−1.

Likewise, the control input of the multiplexing element MUX(j+1) receives not only the second output of the element AIG(j) but also the first output of the element AIG(j+1).

In order to perform the function of routing towards the multiplexer element MUX(j) or, on the contrary, towards the multiplexer element MUX (j+1), the routing element AIG(j) has a routing control input which receives the output of an AND gate G1(j). According to the state of this output, the routing element AIG(j) supplies a logic level 1 (high) either on its first output (first active state of the routing circuit) or on its second output (second active state), the other output being at 0.

This choice thus depends on the output of the gate G1(j). The latter receives, on a first input, the output of the corresponding AND gate G1(j−1) of the preceding order, and, on a second input, information on the state of a fuse F(j) associated with the order j. Consequently, the state of the routing circuit of order j (when it is activated) depends both on the state of the fuse of the same order and on the state of the routing circuit of preceding order AIG(j−1).

More precisely, if the routing circuit of preceding order (j−1) is in its second state (its second output is active), the AND gate G1(j) necessarily places the routing circuit of order j into its second state, and so on for the following orders. To do that, due to the fact that the gate is, in this example an AND gate, there is provision for a zero state on the routing control input to place the routing into the second state. If any routing circuit passes into its second state, this second state is therefore promulgated through all the following routing circuits. Obviously, other very similar logic structures may achieve the same general result.

Moreover, there is provision, if the fuse of order j is intact, for the routing circuit of order j to be placed into its first state. On the contrary, if the fuse is blown, the routing circuit has to be placed into the second state, and this second state is then promulgated through all the circuits of following order up to n.

The fuses may be physical elements which it is possible to burn out electrically or by laser, or may be non-volatile memory cells (EPROM, EEPROM, UPROM) the state of which is altered by electrical programming.

In the preferred example represented, the fuse is a physical element which can be blown electrically by a current which passes through it. The fuse F(j) is in series with a blowing transistor T1(j), the whole in series between two power supply terminals Vdd and Vss. An AND gate G2(j) makes it possible to turn the transistor on in order to blow the fuse; this gate receives, on a first input, the output of the decoder DC(j) of order j (so as to select a single fuse to be blown which is the fuse corresponding to the column which is in the process of being tested); the gate further receives, on a second input, a signal F which is a blowing command. This command is sent only if the column proves to be defective.

The fuse F(j) has one end linked to the power supply voltage Vdd and another end linked to the input of a monostable latch MS(j). The latch is then held in a forced unstable state (output at 1) when the fuse is intact. Its output is linked to the second input of the AND gate G1(j). Blowing of the fuse releases the latch which passes into its stable state (output at 0).

As far as the circuit elements of order 1 are concerned, they are identical to the others, with the exception of the fact that the first input of the AND gate G1(1) of order 1, in continuous operation, receives a high logic level, for example the power supply voltage Vdd.

Finally it will be noted that a transistor T2(j) is preferably provided in order to drive the control of the multiplexer MUX(j) to zero when the line j is defective, this being done in order not to leave this line floating. The transistor T2(j) is an N-channel transistor, for example, linked between the control of the multiplexer MUX(j) and earth; the transistor becomes conducting when the fuse F(j) is burned out.

Thus it will be understood that, with this circuit of FIG. 3, two instances of operation are possible:
 if all the fuses are intact, the designation of the order j by the column decoder connects the lead P to the bit line of order j, for any j from 1 to n;
 if a fuse of order r is blown, the designation of the order j by the column decoder connects the lead P to the bit line of order j for all j from 1 to r−1; and it connects the lead P to the bit line of order j+1 for all j from r to n; the defective column is therefore replaced by the following one, and the addressing of all the other columns is offset by one unit.

Figure 4:
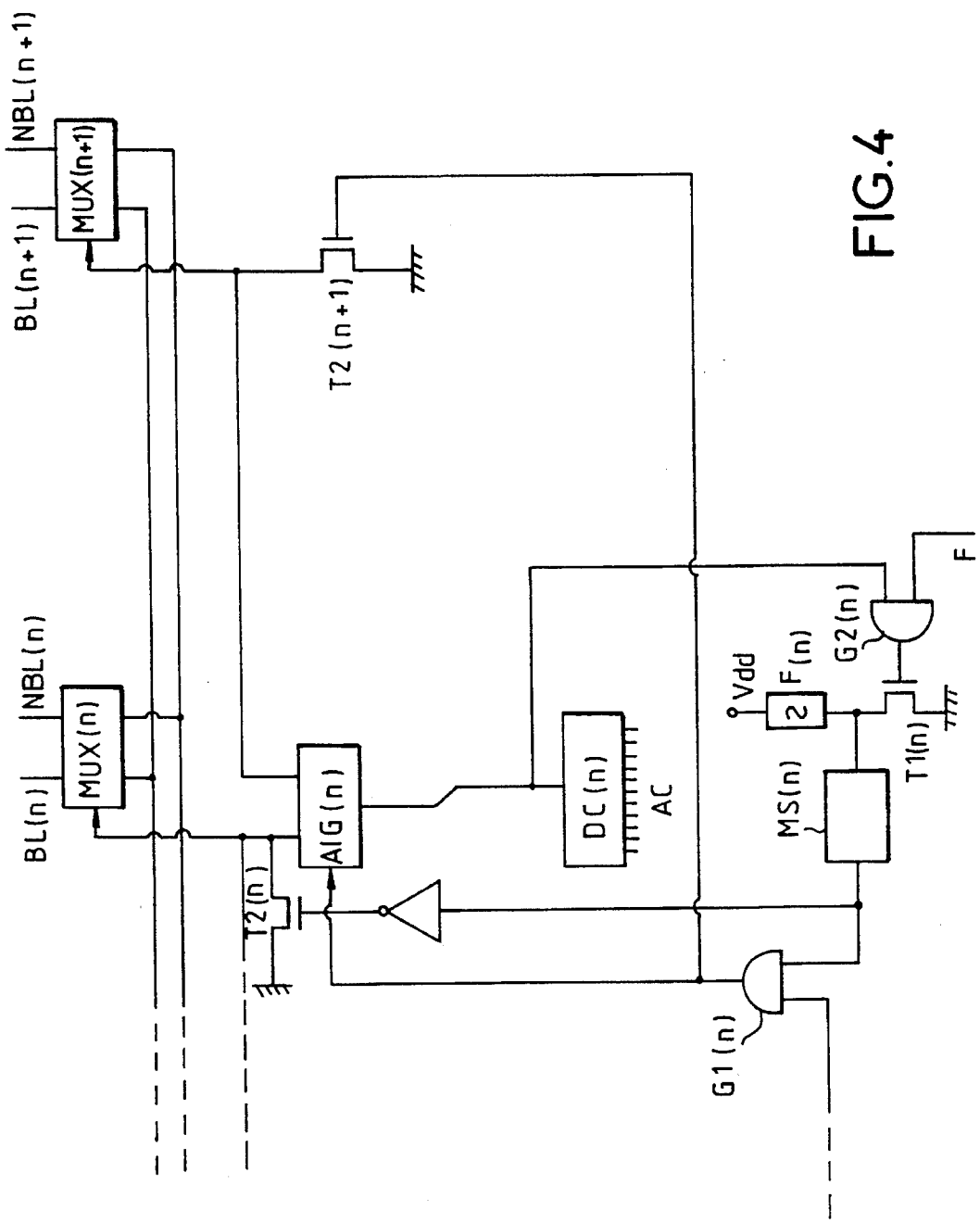
FIG. 4 represents a part which completes FIG. 3 (last orders).

In FIG. 4 the last two orders of the circuit have been represented, namely n and n+1, the circuit elements of order n being identical to the elements of order j of FIG. 3 and the elements for the order n+1 being slightly different since they include neither decoder element DC nor routing element AIG, nor fuse. The multiplexer element MUX(n+1) is controlled only by the second output of the routing circuit of order n. For preference, a transistor T2(n+1) makes it possible to earth this second output so as to isolate the column of order n+1 if redundancy is not used. This transistor is controlled by the output of the AND Gate G1(n) which remains at 1 as long as redundancy is not used.

It will be noted that the last order n+1 does not need a fuse. There are therefore n fuses in all for a decoder having n outputs. In the redundancy circuits of the prior art, n fuses are generally required in order to select one among n lines to be repaired, plus one fuse to indicate that there is a repair.

FIG. 5 represents the redundancy circuits for order j=1.

The only difference with respect to order j is the fact that the AND gate G1(1) receives a logic level 1 on its first input, so that the output of this gate remains at 1 as long as the fuse F(1) is not burned out. A direct link, without gate G1(1), could moreover be provided between the output of the monostable latch MS(1) and the routing AIG(1). In the example represented, a transistor mounted as a resistor keeps the first input of the gate at the positive power supply voltage Vdd.

For preference, the first input of the AND gate G1(1) is linked to a test lead PT, that is to say a lead which is not linked to an external connection wire but on which a test prod can be applied during the on-wafer test operations. The lead subsequently remains isolated in normal operation.

The structure of the invention makes it possible to profit from a very important advantage: the possibility of testing all the columns, including the last one, even if the latter is not used. In order to test the columns from 1 to j, these columns are addressed by the decoder, the lead PT being held at 1 as in the normal configuration of use. The order j designated by the decoder selects the column j as long as the fuses are not blown. If no fuse is blown in the course of the test of the columns 1 to n, the lead PT is made to pass to zero, while the decoder selects the order n. This passage to zero simulates the blowing of an imaginary fuse of order zero, which latches over all the routings of order 1 to n towards the addressing of the columns of order 2 to n+1. The column n+1 is then selected by the decoder and can be tested.

A supplementary advantage of the invention is the possibility of easily dispensing with the voltage power supply to the defective bit line. It is desirable, in fact, for the bit line not to receive a continuous power supply or even a pre-load power supply if it is defective. In fact, a frequent defect is a short-circuit of the bit line to earth, and this short-circuit would persist, with its drawbacks of nugatory current consumption even with repair by a replacement line. Thus a very simple circuit is preferably provided, controlled by the output of the monostable MS(j) for cutting off the power supply to the line of order j if the fuse of order j is blown.

This possibility has been represented in FIG. 6 in a particular example in which the bit line is supplied via a P-channel transistor linked to a power supply line Vdd. The transistor T3(j) supplies the bit line BL(j), and the transistor T'3(j) supplies the complementary line NBL(j). In the prior art, this transistor would have its control gate linked in principle to earth during the instants when the bit line is to be powered. In the invention, the gate of the transistors is controlled via a circuit which prevents the transistors T3(j) and T'3(j) conducting when the fuse of order j is blown. In the example represented, it is assumed that the bit lines are continuously supplied via the transistors, and consequently the gate of the transistors of order j is connected via an inverter to the output of the monostable latch of the same order MS(j). If the bit lines are not continuously powered, the gate is connected to a logic circuit which receives the output of the monostable latch and which takes account of this output in order to prevent the transistors of order j conducting.

We claim:

1. Memory including at least one array of n+1 successive lines of memory storage elements, a decoder DC having n outputs such that an output of order j serves to designate a line defined on the basis of an address applied to the decoder, and redundancy circuitry for replacing any line of memory storage elements which is defective by a replacement line, characterized in that the redundancy circuitry includes first means for making either a line of order j or a line of order j+1 active via an output of order j of the decoder, j varying from 1 to n, said first means comprising, for each order j from 1 to n, a fuse F(j) for making associated with the line of order j and which is capable of being blown under the joint control of the output of order j of the decoder and of a blowing control conductor (F), and a routing circuit (AIG(j)) interposed between the output of order j of the decoder and the lines of order j and j+1, in order to make either the line of order j or the line of order j+1 active via the output of order j of the decoder, said routing circuit being controlled by a logic circuit of order j receiving, on the one hand, information on the state of a fuse of order j and, on the other hand, information originating from a logic circuit of preceding order j−1, except for an order 1, the logic circuit of order 1 including an input linked to a test lead (PT) making it possible to apply a latching command for the routing circuit of order 1.

2. Memory according to claim 1, characterized in that the routing circuit of order j may take a first state for activation of the line of order j and a second state for activation of the line of order j+1, the logic circuit of order j supplying a latching control signal for the routing if the fuse of order j is blown or if a routing of preceding order is in its second state.

3. Memory according to claim 1, characterized in that the redundancy circuitry is such that the line of order j is designated by the output of order j of the decoder when all fuses of order 1 to j are in the intact state and the line of order j+1 is designated by the output of order j of the decoder when any one of the fuses of order 1 to j is destroyed.

4. Memory according to claim 2, wherein the logic circuit of order j, which controls routing of the same order, comprises a monostable latch (MS(j)) linked to the fuse of order j, this latch being held in a first state when the fuse of order j is intact and being released into a second state when the fuse of order j is destroyed, a dual-input gate G1(j) receiving, on the one hand, the output of the monostable latch and, on the other hand, an output of the logic circuit of preceding order, said dual-input gate supplying an output signal applied, on the one hand, to a logic circuit of following order j+1 and, on the other hand, to the routing circuit of order j.

5. Memory according to any one of claims 1–4 characterized in that the lines of the memory storage elements are columns of memory elements connected to a single bit line, and the memory further includes a multiplexer between the bit lines and an input/output lead of the memory, the multiplexer includes individual multiplexing elements MUX(j) each corresponding to one bit line, each multiplexing element routing a given bit line towards an input/output lead, and each multiplexer element of order j, j=1 to n+1, except the first, controlled either by a routing circuit of order j or by a routing circuit of order j−1.

6. Memory according to claim 5, characterized in that the routing circuit of order j has two outputs, one of said two outputs for controlling a multiplexing element of order j, and another one of said two outputs for controlling a multiplexing element of order j+1, depending on whether there is or is not implementation of redundancy in the orders 1 to j.

7. Memory according to claim 6, characterized in that the routing circuit of order j has two inputs: one of said two inputs is a designation control input originating from an output of order j of the decoder, wherein said routing circuit is designated by the decoder when an address corresponding to the order j is received by the decoder; another one of said two inputs of the routing circuit is a routing control input making it possible to designate one of the two outputs of the circuit designated by the decoder, said designated one depending on the implementation or the absence of implementation of redundancy in the orders 1 to j.

8. Memory according to claim 5, characterized in that means are provided for disconnecting a power supply from a defective bit line when the fuse corresponding to said defective fit line is destroyed.

\* \* \* \* \*

UNITED STATES PATENT AND TRADEMARK OFFICE
CERTIFICATE OF CORRECTION

PATENT NO. : 5,506,807
DATED : April 9, 1996
INVENTOR(S) : Richard FERRANT et al.

It is certified that error appears in the above-indentified patent and that said Letters Patent is hereby corrected as shown below:

On the title page, Items [22], [86], [87], the PCT information was omitted from the Letters Patent. The included information should read:

--[22]  PCT Filed:  Sep. 3, 1993

[86]  PCT No.:  PCT/FR93/00842

§ 371 Date:  Mar. 3, 1995

§ 102(e) Date:  Mar. 3, 1995

[87]  PCT Pub. No.:  WO 94/06082

PCT Pub. Date:  Mar. 17, 1994--

Signed and Sealed this

Ninth Day of July, 1996

Attest:

BRUCE LEHMAN

*Attesting Officer*    *Commissioner of Patents and Trademarks*